(12) United States Patent
Wu et al.

(10) Patent No.: US 12,426,207 B2
(45) Date of Patent: Sep. 23, 2025

(54) IMMERSION FLUID MODULE AND SERVER SYSTEM

(71) Applicant: Wiwynn Corporation, New Taipei (TW)

(72) Inventors: Zi Ping Wu, New Taipei (TW); Jun Da Chen, New Taipei (TW); Ting-Yu Pai, New Taipei (TW); Yi Cheng, New Taipei (TW); Chin-Hao Hsu, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 254 days.

(21) Appl. No.: 18/479,831

(22) Filed: Oct. 3, 2023

(65) Prior Publication Data

US 2024/0251530 A1    Jul. 25, 2024

(30) Foreign Application Priority Data

Jan. 19, 2023   (TW) ................. 112102495

(51) Int. Cl.
*H05K 7/20* (2006.01)
(52) U.S. Cl.
CPC ......... *H05K 7/203* (2013.01); *H05K 7/20318* (2013.01); *H05K 7/20818* (2013.01); *H05K 7/20836* (2013.01)

(58) Field of Classification Search
CPC ............................ H05K 7/203; H01L 23/345
See application file for complete search history.

(56) References Cited

U.S. PATENT DOCUMENTS

| | | | |
|---|---|---|---|
| 11,729,948 B2* | 8/2023 | Alissa | H05K 7/20836 361/679.53 |
| 11,997,827 B2* | 5/2024 | Alissa | H05K 7/20836 |
| 2023/0056774 A1* | 2/2023 | Spaeth | F25B 41/20 |
| 2024/0057291 A1* | 2/2024 | Tu | H05K 7/20772 |

* cited by examiner

*Primary Examiner* — Robert J Hoffberg
(74) *Attorney, Agent, or Firm* — JCIPRNET

(57) ABSTRACT

The invention provides an immersion fluid module including a tank, a heat exchanger, a condenser, and at least one pipe. The tank contains a first fluid. An electronic device is disposed in the tank and is at least partially immersed in the first fluid in a liquid state. The heat exchanger is disposed in the tank and is at least partially immersed in the first fluid in the liquid state. The condenser is disposed in the tank. The pipe connects the heat exchanger and the condenser. A second fluid is provided to the pipe, and a temperature of the second fluid is higher than a preset value. When an ambient temperature of the electronic device is lower than the preset value, the second fluid flows through the heat exchanger to raise the ambient temperature of the electronic device. The invention also provides a server system.

20 Claims, 7 Drawing Sheets

IMMERSION FLUID MODULE AND SERVER SYSTEM

CROSS-REFERENCE TO RELATED APPLICATION

This application claims the priority benefit of Taiwan application Ser. No. 112102495, filed on Jan. 19, 2023. The entirety of the above-mentioned patent application is hereby incorporated by reference herein and made a part of this specification.

BACKGROUND

Technical Field

This disclosure relates to an immersion fluid module and a server system.

Description of Related Art

The ambient temperature of the server device varies depending on the area in which the server device is operating. However, when the server device is located in a very low temperature (e.g. −40° C.) environment, it is easy to cause the server device to fail to start up properly. Therefore, how to make the server device can start up normally in low temperature environment is really a problem that the relevant technical personnel need to think about solving.

SUMMARY

An immersion fluid module of the disclosure includes a tank, a heat exchanger, a condenser, and at least one pipe. The tank contains a first fluid. An electronic device is disposed in the tank and is at least partially immersed in the first fluid in a liquid state. The heat exchanger is disposed in the tank and is at least partially immersed in the first fluid in the liquid state. The condenser is disposed in the tank. The at least one pipe connects the heat exchanger and the condenser. The second fluid is provided to the at least one pipe, and a temperature of the second fluid is higher than a preset value. When an ambient temperature where the electronic device is placed is lower than the preset value, the second fluid flows through the heat exchanger and transfers heat to the first fluid through the heat exchanger to raise the ambient temperature where the electronic device is placed.

A server system of the disclosure includes a server device and an immersion fluid module. The immersion fluid module includes tank, a heat exchanger, a condenser, and at least one pipe. The tank contains a first fluid. The server device is disposed in the tank and is at least partially immersed in the first fluid in a liquid state. The heat exchanger is disposed in the tank and is at least partially immersed in the first fluid in the liquid state. The condenser is disposed in the tank. The at least one pipe connects the heat exchanger and the condenser. The second fluid is provided to the at least one pipe, and a temperature of the second fluid is higher than a preset value. When an ambient temperature where the server device is placed is lower than the preset value, the second fluid flows through the heat exchanger and transfers heat to the first fluid through the heat exchanger to raise the ambient temperature where the server device is placed.

To make the aforementioned more comprehensive, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
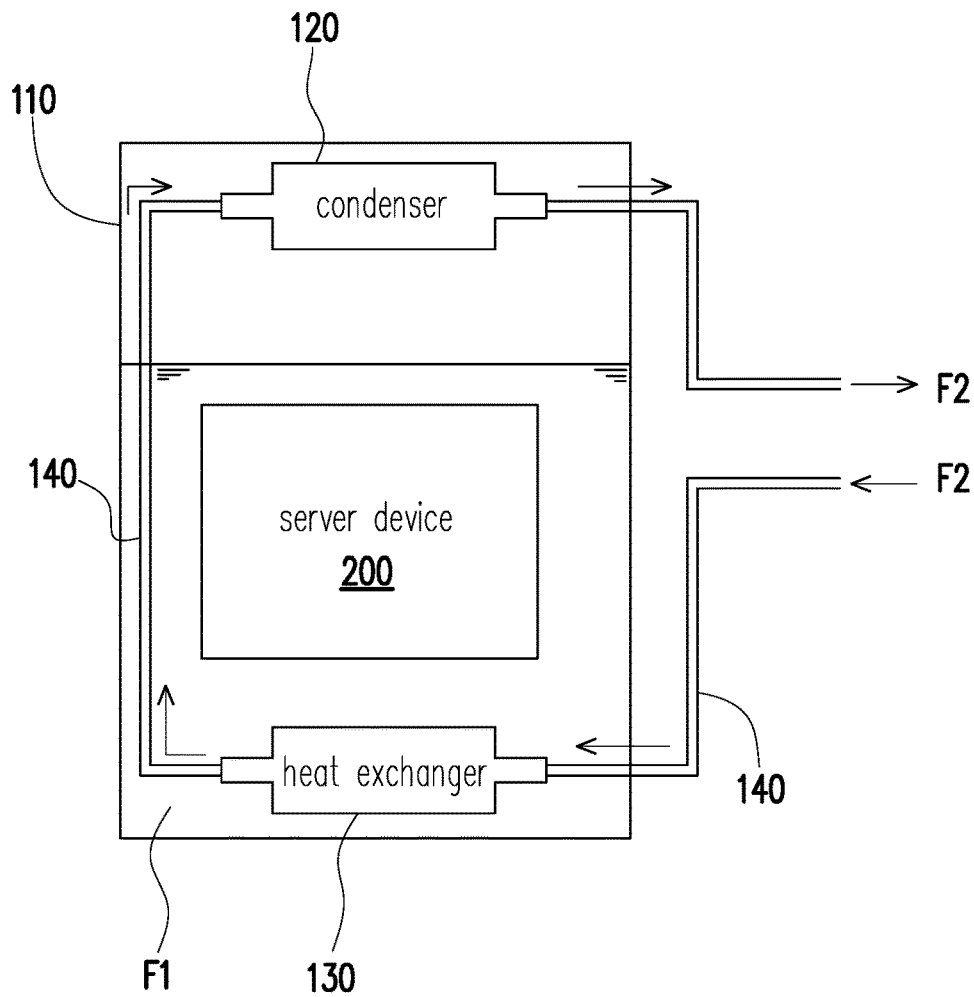
FIG. 1 is a simple schematic diagram of a server system according to an embodiment of the disclosure.

FIG. 1 is a simple schematic diagram of a server system according to an embodiment of the disclosure. Referring to FIG. 1, in this embodiment, a server system 10 is, for example, an immersion cooling edge computing system, which includes a server device 200 and an immersion fluid module 100. The immersion fluid module 100 includes a tank 110, a heat exchanger 130, a condenser 120, and at least one pipe 140. The tank 110 contains a first fluid F1. The server device 200 is disposed in the tank 110, and is at least partially immersed in the first fluid F1 in a liquid state (in general, a heat source of the server device 200 needs to be immersed in the first fluid F1 in the liquid state, while non-heating components may be adjusted adaptively so that they are not immersed in the first fluid F1 in the liquid state, e.g., connection cables). The heat exchanger 130 is disposed in the tank 110, and is at least partially immersed in the first fluid F1 in the liquid state. The condenser 120 is disposed in the tank 110, and is located above the first fluid F1 in the liquid state without being immersed in the first fluid F1 in the liquid state. The pipe 140 connects the heat exchanger 130 and the condenser 120. A second fluid F2 is provided to the pipe 140 and flows into the tank 110, and flows through at least one of the heat exchanger 130 and the condenser 120. A temperature of the second fluid F2 flowing into the tank 110 is higher than a preset value and has a fixed temperature range.

As shown in FIG. 1, this embodiment is illustrated by the heat exchanger 130 immersed in the first fluid F1 in the liquid state. To enable the server system 10 to activate the server device 200 smoothly in a low temperature environment, in this embodiment, when an ambient temperature where the server device 200 is placed is lower than the preset value and has not yet been activated, the second fluid F2 flows through the heat exchanger 130, and transfer heat to the first fluid F1 through the heat exchanger 130 to raise the ambient temperature where the server device 200 is placed. In turn, the second fluid F2 is cooled down by the heat transfer, and leaves the tank 110 after passing through the condenser 120. In short, the second fluid F2 flowing into the tank 110 has the fixed temperature range, and the temperature thereof is higher than a temperature of the second fluid F2 flowing out of the tank 110. In addition, by the aforementioned configuration of the components and the temperature setting of the second fluid F2, when the ambient temperature where the server device 200 is placed is higher than the preset value, the server device 200 reaches an activation temperature, i.e., the server device 200 meets an activation condition.

For example, the preset value is −5° C. to −40° C., while the second fluid F2 is water meeting a W4 rating of American Society of Heating, Refrigerating, and Air-Conditioning Engineers (ASHRAE), whose temperature is 2° C. to 4° C., i.e., the temperature of the second fluid F2 is higher than the preset value. On the other hand, when the ambient temperature where the server device 200 is placed is higher than −5° C., the server device 200 may be activated and thus start to operate. The disclosure does not limit the type of the second fluid F2. In another embodiment, the second fluid F2 may be a fluid mixed with ethylene glycol and water, or a fluid mixed with propylene glycol and water, while also meeting the above temperature conditions.

The first fluid F1 contained in the tank 110 may be a non-conductive liquid with a low boiling point (e.g., 30° C. to 50° C.). When the server device 200 is activated to operate, a heat source thereof (e.g., a central processing unit or a graphics processing unit, not shown herein) begins to generate heat, and an operating temperature of the server device 200 may reach, for example, 55° C. to 125° C. At the same time, the heat generated by the server device 200 is transferred to the first fluid F1, whereby the first fluid F1 in the liquid state boils and phase changes into a gaseous state. On the other hand, since the second fluid F2 flowing into the tank 110 still meets the aforementioned temperature conditions, i.e., whether the first fluid F1 in the liquid state or the first fluid F1 in the gaseous state, the temperature thereof is already higher than the temperature of the second fluid F2. In order to allow the second fluid F2 to be used in the cooling of the server device 200, the temperature of the second fluid F2 needs to be lower than the operating temperature of the server device 200 and the boiling point of the first fluid F1 when the designer selects the fluid type. Accordingly, the second fluid F2 passing through the heat exchanger 130 may cool down the first fluid F1 in the liquid state to dissipate heat from the server device 200. In addition, the second fluid F2 passing through the condenser 120 may make a surface temperature of the condenser 120 lower than the temperature of the first fluid F1 in the gaseous state, so that when the first fluid F1 in the gaseous state contacts a surface of the condenser 120, it cools down and condenses into the liquid state again and falls into the first fluid F1 in the liquid state below for the next cycle. In turn, the heat of the first fluid F1 in the gaseous state may be transferred to the second fluid F2 through the condenser 120, and then the second fluid F2 leaves the tank 110. In short, the second fluid F2 flowing into the tank 110 still has the fixed temperature range, and the temperature thereof is lower than the temperature of the second fluid F2 flowing out of the tank 110. In this way, the heat of the server device 200 may be carried out of the server system 10 through a phase change of the first fluid F1 by the aforementioned configuration of the components and the temperature setting of the second fluid F2.

In some cases, a heater may be used in conjunction with a controller capable of operating at low temperatures to raise the ambient temperature of the server device 200. However, the controller has a power loop and therefore requires additional corresponding openings in the tank to install the power loop. In other words, the tank has at least an inlet opening, an outlet opening, and a power loop opening, resulting in lower reliability of tank sealing. In addition, a pressure difference between the inside and outside of the tank increases the difficulty and cost of tank sealing in low temperature environment. In contrast, the server system 10 of the disclosure forms a unidirectional loop with the pipe 140, the heat exchanger 130, and the condenser 120, which means that the pipe 140 only needs to form a single inlet and a single outlet on the tank 110 to enable the server device 200 to achieve the purpose of activation at low temperature, and at the same time, the difficulty of sealing the tank 110 may be avoided by reducing the number of openings, which effectively simplifies the manufacturing process and reduce the production cost.

It should also be noted that this embodiment does not limit the implementation object of the immersion fluid module 100, which may also be other electronic devices that need to be operated under the aforementioned environmental conditions (e.g., the preset value is −5° C. to −40° C.). Any electronic device that requires activation at low temperature and heat dissipation at high temperature may be implemented by the unidirectional loop of the immersion fluid module 100.

Figure 2:
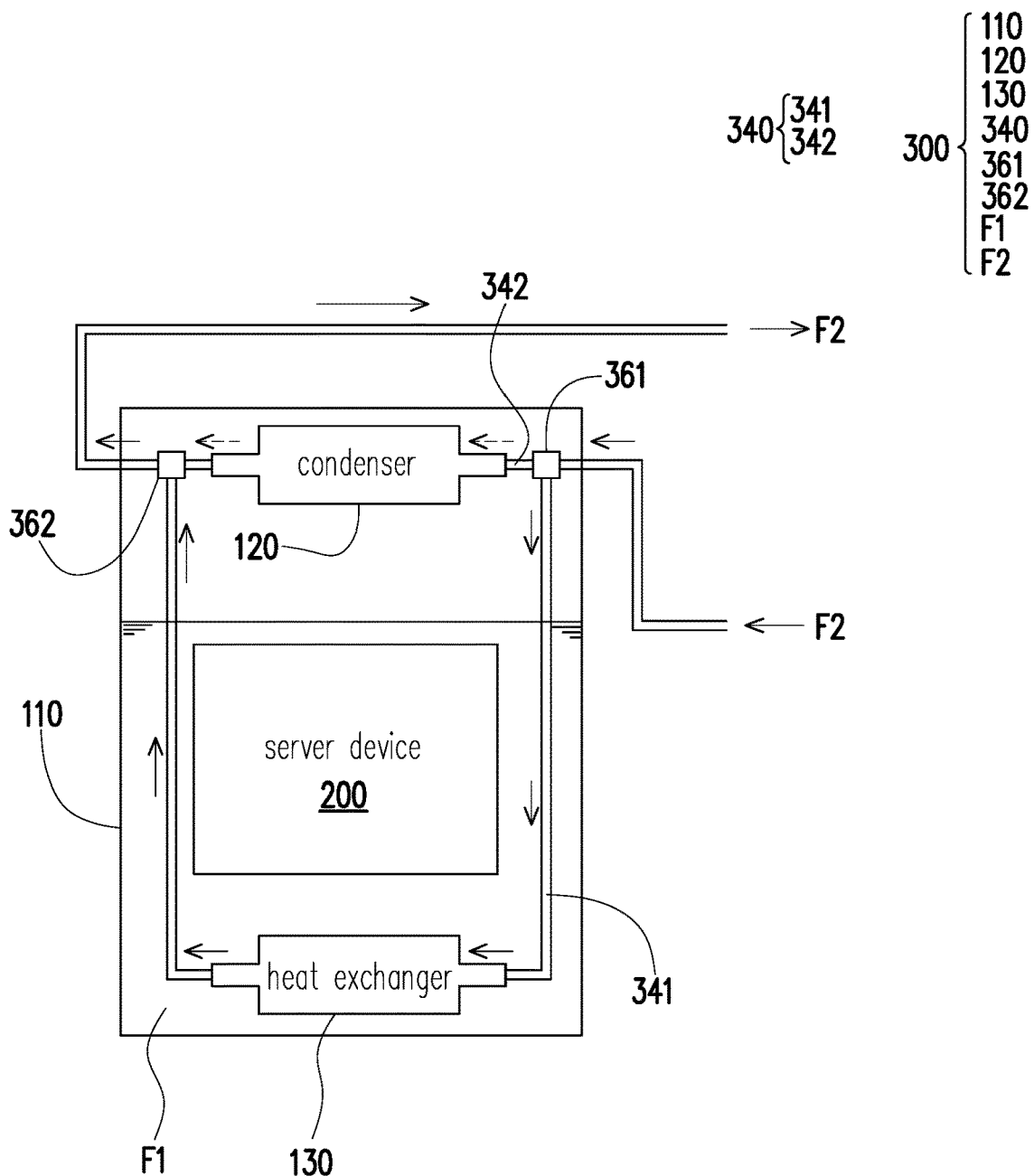
FIG. 2 is a simple schematic diagram of a server system according to another embodiment of the disclosure.

FIG. 2 is a simple schematic diagram of a server system according to another embodiment of the disclosure. Referring to FIG. 2, in this embodiment, a server system 20 includes an immersion fluid module 300 and the server device 200. A difference from the previous embodiments lies in the configuration of the pipe. The immersion fluid module 300 further includes two diverters 361 and 362, which are disposed on and divert the pipe 340, so as to separate the heat exchanger 130 and the condenser 120 on two branch pipes 341 and 342 in parallel with each other. In one embodiment, a user may manually adjust on/off states of the diverters 361 and 362 according to the state and demand of the server device 200 to control a flow direction of the second fluid F2, so that the second fluid F2 flows through the branch pipe 341 where the heat exchanger 130 is located (as shown by directions of solid arrows in FIG. 2) and not through the branch pipe 342 where the condenser 120 is located; or so that the second fluid F2 flows through the branch pipe 342 where the condenser 120 is located (as shown by a direction of dashed arrows in FIG. 2) and not through the branch pipe 341 where the heat exchanger 130 is located. In this way, the effect of the previous embodiment may be achieved while further effectively reducing flow resistance of the second fluid F2 in the pipe 340.

Figure 3A:
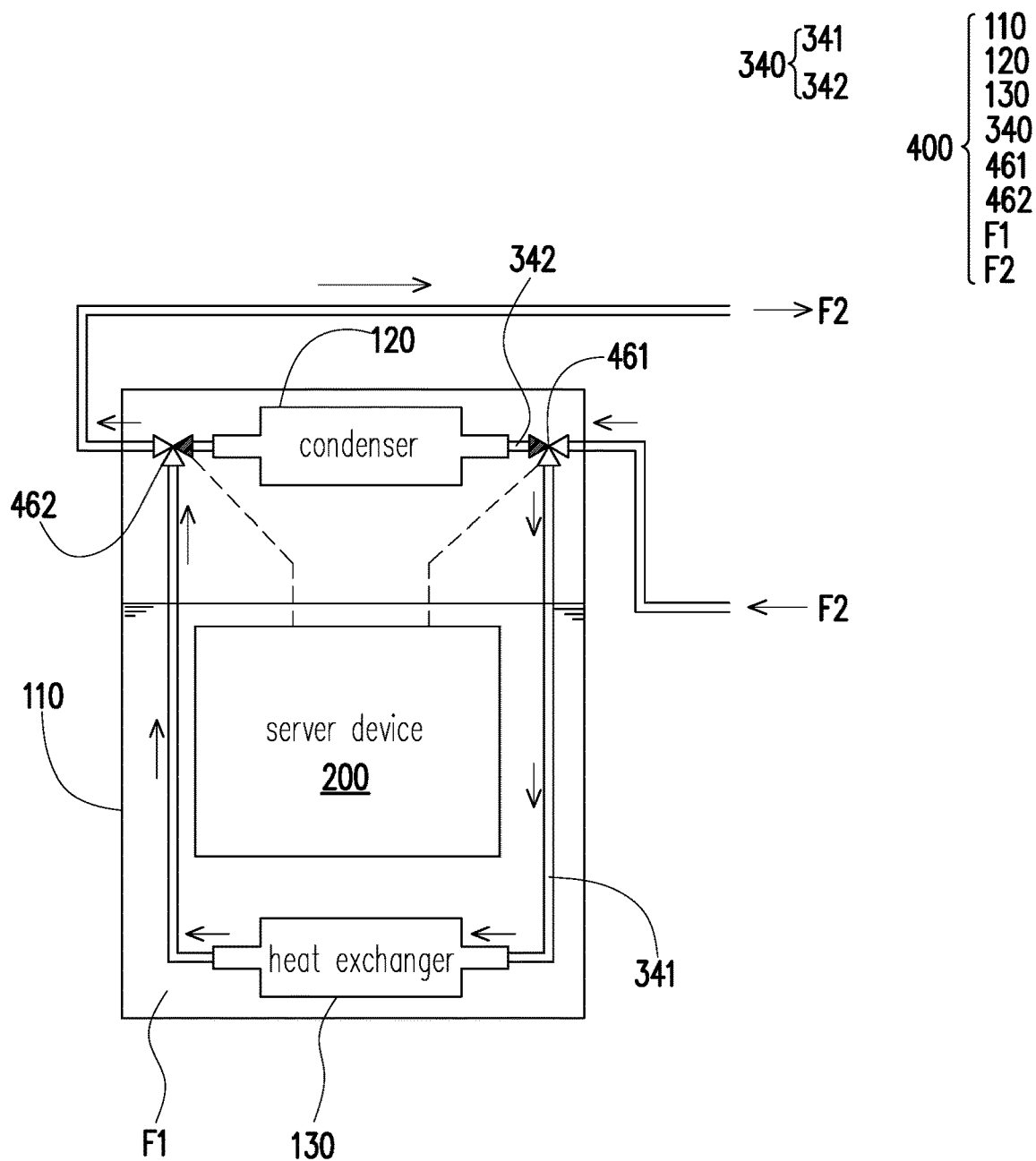
FIG. 3A is a simple schematic diagram of a server system according to another embodiment of the disclosure.
Figure 3B:
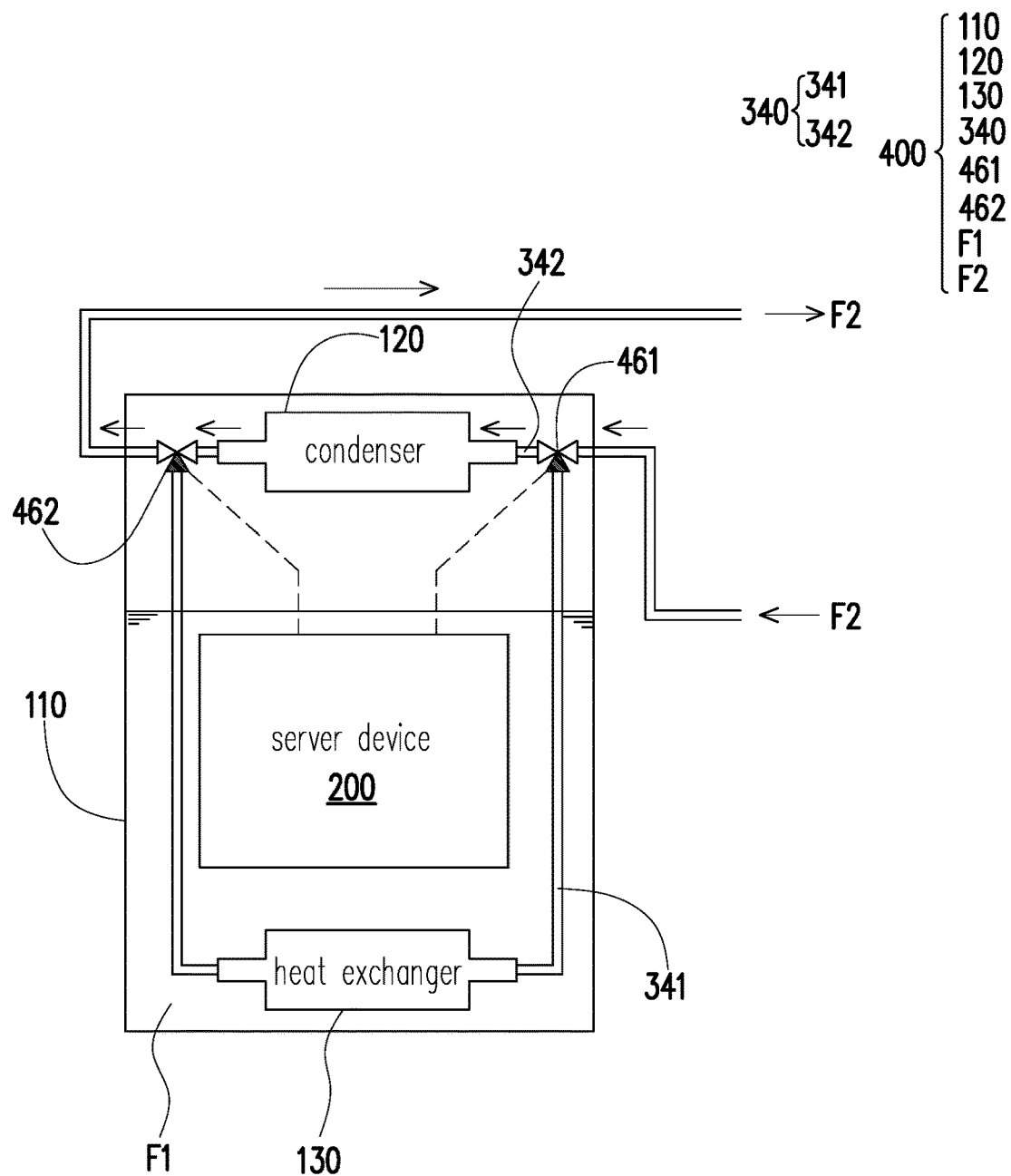
FIG. 3B is a schematic diagram of another state of the server system in FIG. 3A.

FIG. 3A is a simple schematic diagram of a server system according to another embodiment of the disclosure. FIG. 3B is a schematic diagram of another state of the server system in FIG. 3A. Referring to FIG. 3A and FIG. 3B at the same time, in this embodiment, a server system 30 includes an immersion fluid module 400 and the server device 200. A difference from the embodiment shown in FIG. 2 is that a diverter of this embodiment is illustrated by electromagnetic three-way valves 461 and 462. The electromagnetic three-way valves 461 and 462 are further communicationally connected to the server device 200 to change a connection status thereof according to whether the server device 200 is activated or not, thus achieving the same effect as the embodiment described in FIG. 2.

For example, as shown in FIG. 3A, when the server device 200 is in a low temperature environment and has not yet been activated, the electromagnetic three-way valves 461 and 462 do not receive an activation signal from the server device 200. Thus, the electromagnetic three-way valves 461 and 462 open the branch pipe 341 where the heat exchanger 130 is located and close the branch pipe 342 where the condenser 120 is located, so that the second fluid F2 flows in the branch pipe 341 and does not flow in the branch pipe 342. That is, at this time, the second fluid F2 does not pass through the condenser 120, but passes through the heat exchanger 130 to supply heat thereof to the first fluid F1. In this way, the ambient temperature where the server device 200 is placed may be raised and the server device 200 may reach the activation temperature.

Next, as shown in FIG. 3B, when the server device 200 is activated, the electromagnetic three-way valves 461 and 462 switch states after receiving the activation signal from the server device 200, and thus, the electromagnetic three-way valves 461 and 462 close the branch pipe 341 where the heat exchanger 130 is located and open the branch pipe 342 where the condenser 120 is located, so that the second fluid F2 flows in the branch pipe 342 and does not flow in the branch pipe 341. That is, at this time, the second fluid F2 does not pass through the heat exchanger 130, but passes through the condenser 120. In this way, when the first fluid F1 changes from a liquid phase to a gaseous phase due to the heat generated by the server device 200, the heat thereof may be transferred to the second fluid F2 through the condenser 120 and carried out of the server system 30 to achieve the effect of cooling the server device 200.

Figure 4A:
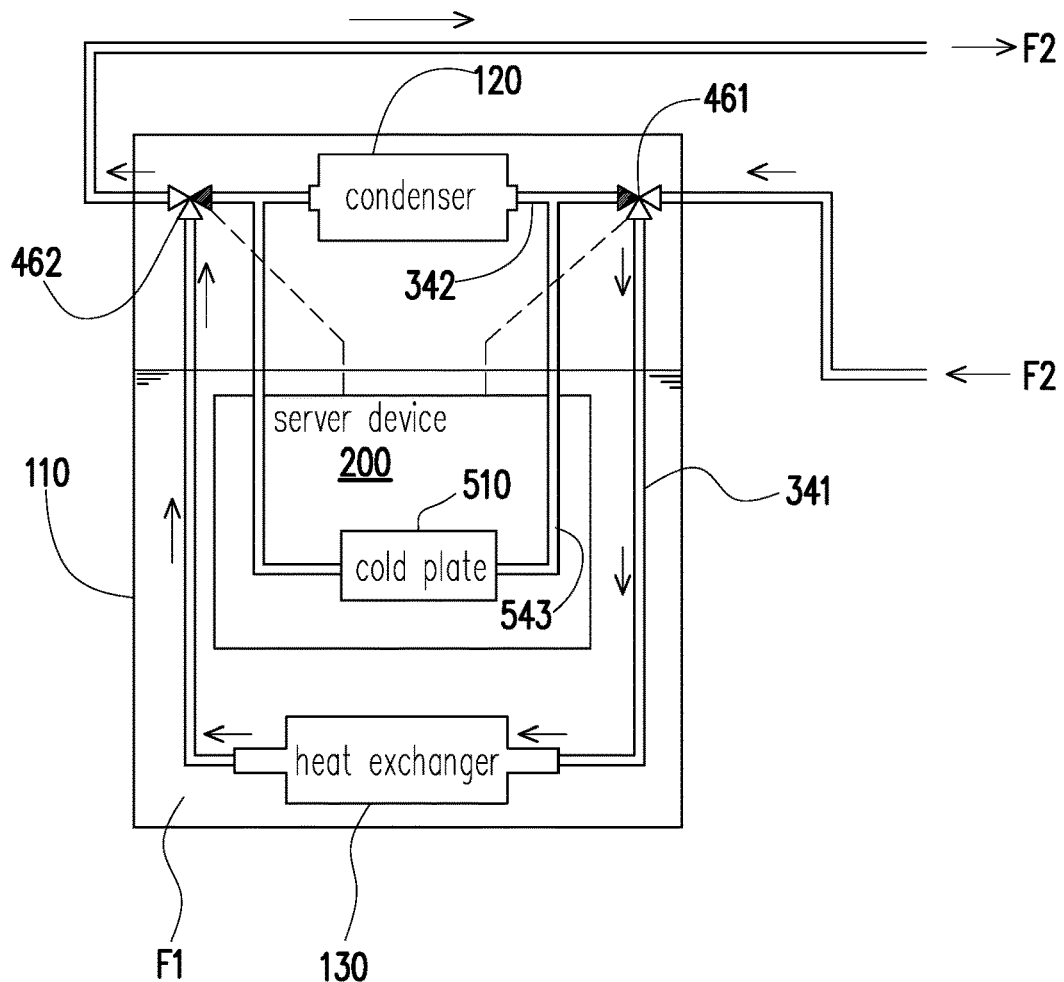
FIG. 4A is a simple schematic diagram of a server system according to another embodiment of the disclosure.
Figure 4B:
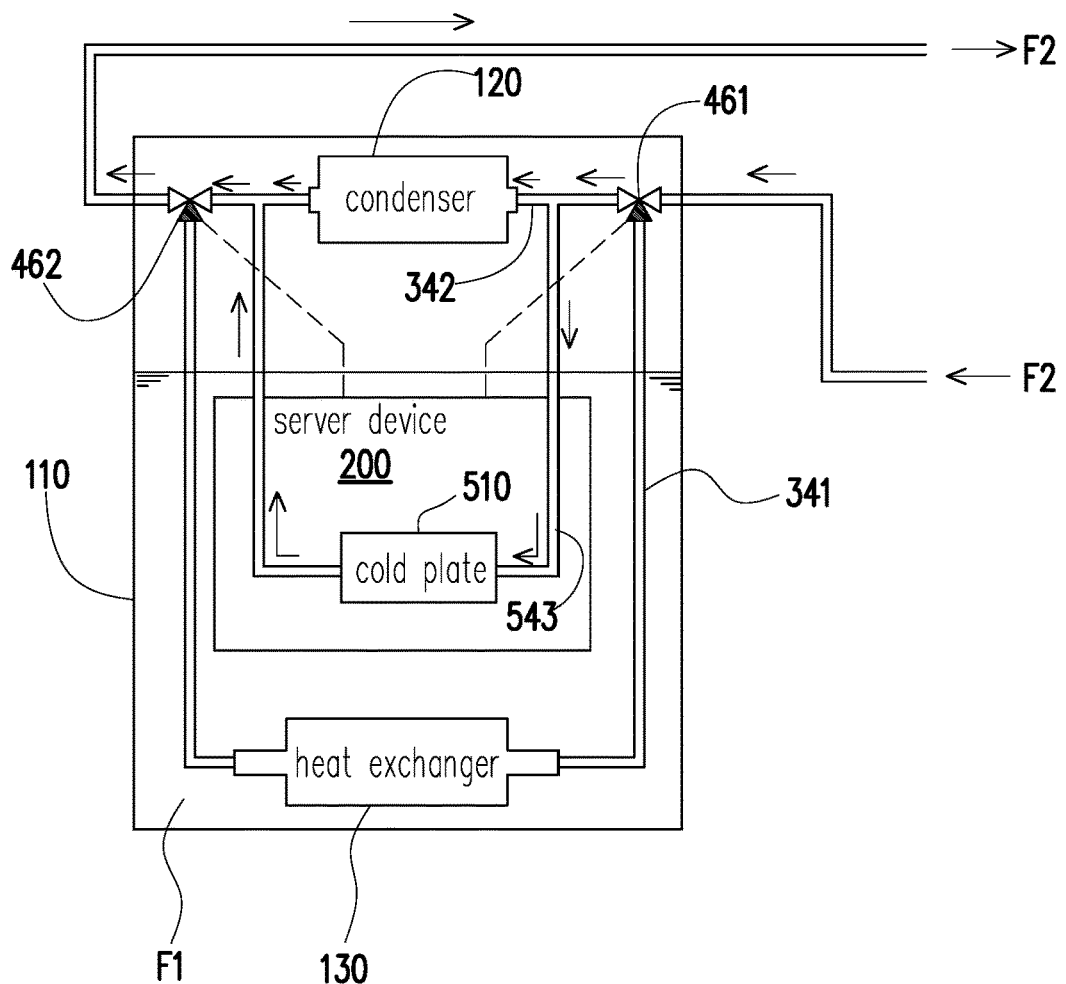
FIG. 4B is a schematic diagram of another state of the server system of FIG. 4A.

FIG. 4A is a simple schematic diagram of a server system according to another embodiment of the disclosure. FIG. 4B is a schematic diagram of another state of the server system of FIG. 4A. Referring to FIG. 4A and FIG. 4B at the same time, in this embodiment, a server system 40 includes the server device 200 and an immersion fluid module 500. A difference from the embodiment shown in FIG. 3 is that the immersed fluid module 500 further includes a cold plate 510, which is in thermal contact with the heat source (not shown herein) of the server device 200 to directly dissipate heat from the heat source. Moreover, the electromagnetic three-way valves 461 and 462 of this embodiment are disposed on and divert a pipe 540, so as to separate the heat exchanger 130, the condenser 120, and the cold plate 510 on three branch pipes 341, 342, and 543 in parallel with each other. In addition, the connection status of the electromagnetic three-way valves 461 and 462 is changed according to whether the server device 200 is activated or not to control the flow direction of the second fluid F2, so that the second fluid F2 flows through the branch pipe 341, or flows through the branch pipes 342 and 543.

For example, as shown in FIG. 4A, when the server device 200 is in a low temperature environment and has not yet been activated, the electromagnetic three-way valves 461 and 462 do not receive the activation signal from the server device 200. Thus, the electromagnetic three-way valves 461 and 462 open the branch pipe 341 where the heat exchanger 130 is located, and close the branch pipe 342 where the condenser 120 is located and the branch pipe 543 where the cold plate 510 is located, so that the second fluid F2 flows in the branch pipe 341 and does not flow in the branch pipes 342 and 543. That is, at this time, the second fluid F2 does not pass through the condenser 120 and the cold plate 510, but passes through the heat exchanger 130 to supply heat thereof to the first fluid F1. In this way, the ambient temperature where the server device 200 is placed may be raised and the server device 200 may reach the activation temperature.

Next, as shown in FIG. 4B, when the server device 200 is activated, the electromagnetic three-way valves 461 and 462 switch states after receiving the activation signal from the server device 200, and thus, the electromagnetic three-way valves 461 and 462 close the branch pipe 341 where the heat exchanger 130 is located, and open the branch pipe 342 where the condenser 120 is located and the branch pipe 543 where the cold plate 510 is located, so that the second fluid F2 flows in the branch pipes 342 and 543 and does not flow in the branch pipe 341. That is, at this time, the second fluid F2 does not pass through the heat exchanger 130, but passes through the condenser 120 and the cold plate 510. In this way, when the first fluid F1 changes from a liquid phase to a gaseous phase due to the heat generated by the server device 200, the heat thereof may be transferred to the second fluid F2 through the condenser 120 and carried out of the server system 40. In addition, the heat generated by the heat source of the server device 200 may be further transferred to the second fluid F2 through the cold plate 510 to directly dissipate heat from the heat source, thereby improving heat dissipation efficiency of the second fluid F2 for the server device 200.

Figure 5:
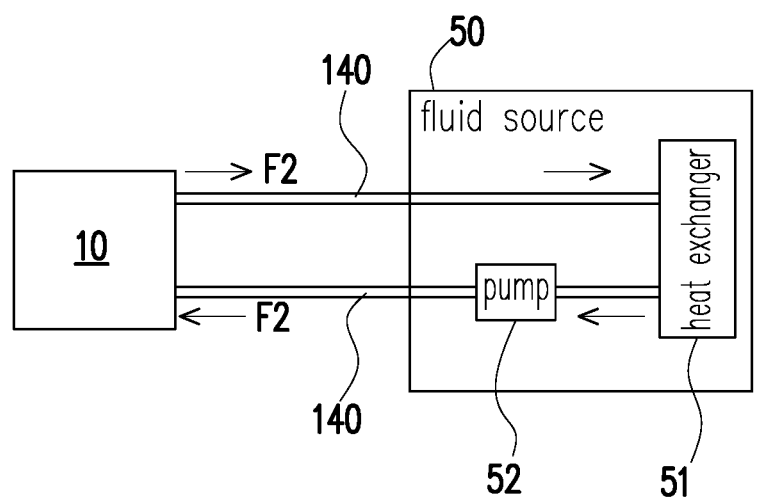
FIG. 5 is an application diagram of a server system according to an embodiment of the disclosure.

FIG. 5 is an application diagram of a server system according to an embodiment of the disclosure to describe a means of providing a second fluid in the server system, herein illustrated by the server system 10 shown in FIG. 1. Referring to FIG. 5, in this embodiment, the server system 10 obtains the second fluid F2 through a fluid source 50. The pipe 140 of the server system 10 is connected to the fluid source 50 after leaving the tank 110. The fluid source 50 includes a heat exchanger 51 and a pump 52. The heat exchanger 51 is used to heat the second fluid F2 leaving the tank 110, and then the second fluid F2 may be pressurized by the pump 52 and transferred into the tank 110 through the pipe 140. In this way, the second fluid F2 may meet the above-mentioned temperature conditions higher than the preset value.

To sum up, in the embodiments of the disclosure, when the ambient temperature where the electronic device or the server device is placed is lower than the preset value, the immersion fluid module provides the second fluid with a temperature higher than the preset value to the pipe to transfer the heat from the second fluid to the first fluid through the heat exchanger, which causes the ambient temperature where the electronic device or the server device is placed to rise, thus allowing the electronic device or the server device to reach a required temperature to be activated.

On the other hand, when the electronic device or the server device is activated to operate, the heat source thereof begins to generate heat, and according to the disclosure, since a second fluid with a fixed temperature range may be steadily supplied both before and after the electronic device or the server device is activated, the second fluid may be converted into a role of heat dissipation for the electronic device or the server device.

Compared with the aforementioned configuration of the heater and the controller, which requires additional corresponding power loop openings on the tank, the immersion fluid module or the server system of this disclosure forms a unidirectional loop with the pipe, the heat exchanger, and the condenser, and the pipe only needs to form a single inlet and a single outlet on the tank, which not only reduces the connection between the internal environment of the tank and the external environment, improves the hermeticity and structural strength of the tank, but also effectively simplifies the configuration of components and manufacturing process, and reduces costs.

It will be apparent to those skilled in the art that various modifications and variations can be made to the disclosed embodiments without departing from the scope or spirit of the disclosure. In view of the forthcoming, it is intended that the disclosure covers modifications and variations provided that they fall within the scope of the following claims and their equivalents.

What is claimed is:

1. An immersion fluid module comprising:
a tank containing a first fluid, an electronic device disposed in the tank, and the electronic device at least partially immersed in the first fluid in a liquid state;
a heat exchanger disposed in the tank, and the heat exchanger at least partially immersed in the first fluid in the liquid state;
a condenser disposed in the tank; and
at least one pipe connecting the heat exchanger and the condenser, a second fluid provided to the at least one pipe, and a temperature of the second fluid being higher than a preset value,
wherein when an ambient temperature where the electronic device is placed is lower than the preset value, the second fluid flows through the heat exchanger, and transfers heat to the first fluid through the heat exchanger to raise the ambient temperature where the electronic device is placed.

2. The immersion fluid module according to claim 1, wherein the second fluid is water having a temperature of 2° C. to 45° C.

3. The immersion fluid module according to claim 1, wherein the temperature of the second fluid is also lower than an operating temperature of the electronic device and a boiling point of the first fluid.

4. The immersion fluid module according to claim 1, wherein an inlet temperature of the second fluid flowing into the tank is higher than an outlet temperature of the second fluid flowing out of the tank.

5. The immersion fluid module according to claim 1 further comprising two diverters disposed on and diverting the at least one pipe to separate the heat exchanger and the condenser on two branch pipes in parallel with each other.

6. The immersion fluid module according to claim 5, wherein the two diverters are respectively electromagnetic three-way valves communicationally connected to the electronic device, such that a connection status of the two electromagnetic three-way valves are changed according to whether the electronic device is activated or not.

7. The immersion fluid module according to claim 6, wherein when the electronic device is not activated, the two electromagnetic three-way valves open a first one of the two branch pipes where the heat exchanger is located and close a second one of the two branch pipes where the condenser is located; when the electronic device is activated, the two electromagnetic three-way valves close the first one of the two branch pipes where the heat exchanger is located and open the second one of the two branch pipes where the condenser is located.

8. The immersion fluid module according to claim 1, wherein the at least one pipe forms a single inlet and a single outlet on the tank.

9. The immersion fluid module according to claim 1, wherein when the electronic device is not activated, the second fluid flowing into the tank has a fixed temperature range; and when the electronic device is activated, the second fluid flowing into the tank has the fixed temperature range.

10. The immersion fluid module according to claim 1, wherein when the ambient temperature of where the electronic device is placed is higher than the preset value, the electronic device is activated.

11. A server system comprising:
a server device;
an immersion fluid module comprising:
a tank containing a first fluid, the server device disposed in the tank, and the server device at least partially immersed in the first fluid in a liquid state;
a heat exchanger disposed in the tank, and the heat exchanger at least partially immersed in the first fluid in the liquid state;
a condenser disposed in the tank; and
at least one pipe connecting the heat exchanger and the condenser, a second fluid provided to the at least one pipe, and a temperature of the second fluid being higher than a preset value,
wherein when an ambient temperature where the server device is placed is lower than the preset value, the second fluid flows through the heat exchanger, and transfers heat to the first fluid through the heat exchanger to raise the ambient temperature where the server device is placed.

12. The server system according to claim 11, wherein the second fluid is water having a temperature of 2° C. to 45° C.

13. The server system according to claim 11, wherein the temperature of the second fluid is also lower than an operating temperature of the server device and a boiling point of the first fluid.

14. The server system according to claim 11, wherein an inlet temperature of the second fluid flowing into the tank is higher than an outlet temperature of the second fluid flowing out of the tank.

15. The server system according to claim 11, wherein the immersion fluid module further comprises two diverters disposed on and diverting the at least one pipe to separate the heat exchanger and the condenser on two branch pipes in parallel with each other.

16. The server system according to claim 15, wherein the two diverters are respectively electromagnetic three-way valves communicationally connected to the server device, such that a connection status of the two electromagnetic three-way valves are changed according to whether the server device is activated or not.

17. The server system according to claim 16, wherein when the server device is not activated, the two electromagnetic three-way valves open a first one of the two branch pipes where the heat exchanger is located and close a second one of the two branch pipes where the condenser is located; when the server device is activated, the two electromagnetic three-way valves close the first one of the two branch pipes where the heat exchanger is located and open the second one of the two branch pipes where the condenser is located.

18. The server system according to claim 11, wherein the at least one pipe forms a single inlet and a single outlet on the tank.

19. The server system according to claim 11, wherein when the server device is not activated, the second fluid flowing into the tank has a fixed temperature range; and when the server device is activated, the second fluid flowing into the tank has the fixed temperature range.

20. The server system according to claim 11, wherein when the ambient temperature of where the server device is placed is higher than the preset value, the server device is activated.

* * * * *